(12) United States Patent
Zavadsky et al.

(10) Patent No.: US 8,701,058 B2
(45) Date of Patent: Apr. 15, 2014

(54) INTEGRATED CIRCUIT ANALYSIS SYSTEMS AND METHODS

(75) Inventors: Vyacheslav L. Zavadsky, Ottawa (CA); Edward Keyes, Ottawa (CA)

(73) Assignee: Semiconductor Insights Inc., Kanata, Ontario (CA)

( * ) Notice: Subject to any disclaimer, the term of this patent is extended or adjusted under 35 U.S.C. 154(b) by 340 days.

(21) Appl. No.: 12/817,727

(22) Filed: Jun. 17, 2010

(65) Prior Publication Data

US 2010/0325593 A1 Dec. 23, 2010

Related U.S. Application Data

(60) Provisional application No. 61/218,294, filed on Jun. 18, 2009.

(51) Int. Cl.
   *G06F 17/50* (2006.01)
(52) U.S. Cl.
   USPC .......................................... 716/104
(58) Field of Classification Search
   USPC ................................. 716/100–105
   See application file for complete search history.

(56) References Cited

U.S. PATENT DOCUMENTS

| | | | |
|---|---|---|---|
| 7,207,018 B2 | 4/2007 | Zavadsky et al. | |
| 7,278,121 B2 | 10/2007 | Aitnouri et al. | |
| 7,643,665 B2 | 1/2010 | Zavadsky et al. | |
| 7,693,348 B2 | 4/2010 | Zavadsky et al. | |
| 7,751,643 B2 | 7/2010 | Zavadsky et al. | |
| 7,765,517 B2 | 7/2010 | Ouali et al. | |
| 8,104,000 B2 * | 1/2012 | Bjesse | 716/106 |
| 8,219,940 B2 | 7/2012 | Ouali et al. | 716/51 |
| 2002/0138812 A1 * | 9/2002 | Johannsen | 716/5 |
| 2002/0162086 A1 * | 10/2002 | Morgan | 716/18 |
| 2006/0045325 A1 | 3/2006 | Zavadsky et al. | 382/145 |
| 2006/0156264 A1 | 7/2006 | Shoji | 716/5 |
| 2006/0225021 A1 * | 10/2006 | Padalia et al. | 716/17 |
| 2007/0011628 A1 | 1/2007 | Ouali et al. | 716/2 |
| 2007/0256037 A1 | 11/2007 | Zavadsky et al. | |

FOREIGN PATENT DOCUMENTS

| | | |
|---|---|---|
| CN | 1839390 A | 9/2006 |
| CN | 101063987 A | 10/2007 |
| CN | 101393640 A | 3/2009 |
| EP | 1679627 A1 | 7/2006 |

OTHER PUBLICATIONS

P. Das, et al., "Semiautomatic Segmentation With Compact Shape, Prior, Imaging and Vision Computing," Mar. 2008.

(Continued)

*Primary Examiner* — Binh Tat
(74) *Attorney, Agent, or Firm* — Winston & Strawn LLP

(57) ABSTRACT

The current invention uses structural data mining methods and systems, combined with partitioning hints and heuristics, to locate high level library functional blocks in a gate level netlist of an integrated circuit (IC). In one embodiment of the invention, the library is created by synthesizing various design blocks and constraints. The method supports characterization matching between a netlist and a library, between libraries and between netlists. The data mining method described herein uses a subgraph growing method to progressively characterize the graph representation of the netlist of the IC. In one embodiment of the invention, alternative hashing is used to perform subgraph characterization. Further, the located high level functional blocks may be used to substitute the corresponding portions of the target netlist having the matched characterizations, and may be annotated accordingly in the resulting netlist.

10 Claims, 14 Drawing Sheets

(56) References Cited

OTHER PUBLICATIONS

E. Keyes, et al., "Open Algorithmical problems in the Analysis of Integrated Circuits," 2003, University of Minnesota Industrial Problems Seminar.

A. Lester, et al., "YAGLE, a Second Generation Functional Abstractor for CMOS VLSI Circuits," Proceedings of the Tenth International Conference on Microelectronics, 1998, pp. 265-268.

M. Boehner, "LOGEX—An Automatic Logic Extractor from Transistor to Gate Level for CMOS Technology," Design Automation Conference, 1988, Proceedings, 25$^{th}$ ACM/IEEE, pp. 517-522.

M. Ohlrich, et al., "SubGemini: Identifying SubCircuits Using a Fast Subgraph Isomorphism Algorithm," Design Automation, 1993, pp. 31-37.

C. Meinel, et al., "Algorithms and Data Structures in VLSI-Design: OBDD-Foundations and Applications," Springer-Verlag, Berlin, Heidelberg, NY, 1998.

R. Duda, et al., "Pattern Classification," (2$^{nd}$ Ed.), John Wiley & Sons, 2001.

B. McKay, et al., "Isomorphism of Two Large Designs," Ars Combinatoria, vol. 6, 1978, pp. 87-90.

B. McKay, et al., "Practical Graph Isomorphism," 10$^{th}$ Manitoba Conference on Numerical Mathematics and Computing (Winnipeg, 1980), Congressus Numerantium, vol. 30 (1981), pp. 45-87.

J. White, et al., "Candidate Subcircuits for Functional Module Identification in Logic Circuits," pp. 34-38, 2000, (white,wojcik,chung)@cse.msu,edu; travis.doom@wright.edu.

T. Doom, et al., "Identifying High-Level Components in Combinational Circuits," 1998.

L. Yang, et al., "FROSTY: A Fast Hierarchy Extractor for Industrial CMOS Circuits," University of Washington, pp. 741-746, 2003.

\* cited by examiner

| Hash Value 64Bit | Locations | Count | Predecessors | Block Kinds |
|---|---|---|---|---|
| 257 | 1. Rtl (I17), 1. Rtl (I18) .... | 75 | | Adder - 75 |
| 258 | 1. Rtl (I40), 1. Rtl (I41) .... | 81 | | Adder - 75 |
| ... | | | | |
| 493 | 1. Rtl (I17, I40), 1. Rtl (I41, I18) | 70 | 257, 258 | Adder - 75 |
| 903 | 1. Rtl (I17, I40, I44) | 2 | 493 | |

Figure 4

| | Library Occurrences | Target occurrences |
|---|---|---|
| Seed $A_0$ | L1, L2, L3, L4, L5 | N10, N20, N50, .... |
| Seed $A_1$ | L1, L3, L5 | N10, N50, N55, .... |
| Seed $A_2$ | L1 | N10, N50, .... |
| ... | | |
| Seed $A_n$ | Complete | N10, N50 |

Figure 6

A BDD for (x1 = y1) && (x2 = y2) ← 3302

| Seed 1 | List of occurrences in target | List of occurrences in Library |
|---|---|---|
| Seed 2 | List of occurrences in target | List of occurrences in Library |
| Seed 3 | List of occurrences in target | List of occurrences in Library |
| Seed 4 | List of occurrences in target | List of occurrences in Library |
| Seed N | List of occurrences in target | List of occurrences in Library |

Figure 9

| | Library Occurrences | Target occurrences |
|---|---|---|
| Seed $A_0$ | L1, L2, L3, L4, L5 | N10, N20, N50, .... |
| Seed $A_1$ | L1, L3, L5 | N10, N50, N55, .... |
| Seed $A_2$ | L1 | N10, N50, .... |
| Seed $A_n$ | Null | N10, N50, .... ← New module? |

Figure 10

| | Library Occurrences | Target occurrences |
|---|---|---|
| Seed $A_0$ | L1, L2, L3, L4, L5 | N10, N20, N50, .... |
| Seed $A_1$ | L1, L3, L5 | N10, N50, N55, .... |
| Seed $A_2$ | L1 | N10, N50, .... |
| Seed $A_n$ | Null | N10, N50,.... |

All 16 bit ALU's

New 16 bit ALU

Figure 11

INTEGRATED CIRCUIT ANALYSIS SYSTEMS AND METHODS

CROSS-REFERENCE TO RELATED APPLICATION

This Application relates to and claims priority to U.S. Provisional Patent Application No. 61/218,294 filed Jun. 18, 2009, entitled INTEGRATED CIRCUIT ANALYSIS SYSTEMS AND METHODS, the entirety of which is incorporated herein by reference.

FIELD OF THE INVENTION

The present invention pertains to the field of integrated circuits and in particular to integrated circuit analysis systems and methods.

BACKGROUND OF THE INVENTION

As will be appreciated by the person of ordinary skill the art, understanding the functionality of an integrated circuit (IC), for example, a digital IC, starting from the finished device can be challenging. For example, modern digital IC designs are often created using a highly automated process. For instance, they are typically designed by writing a high level description of their function in a hardware description language which is then synthesized to the logic gate level. This approach, along with the increasing use of libraries of previously designed circuit sub-blocks (e.g. hard and/or soft "macros") can enable the routine creation of a wide variety of gate designs.

The highly automated process, also known as auto-routing, often includes software programs that automatically place electrical components in a space efficient manner, which may not necessarily result in logically ordered or visually appealing circuit layouts. As a result, circuit elements representing the same functional block may have different layouts.

While IC reverse engineering technologies have been developed to recreate, with a reasonable degree of automation and accuracy, a low level netlist (otherwise known as gate, primitive or cell level netlists) of an IC, organization and analysis of these netlists into functional, modular and/or hierarchical blocks currently still heavily relies on substantial expert level human effort, which is not only highly time consuming, but can also be highly cost ineffective.

Different approaches have been developed in the art to provide automated logic extraction from ICs or functional identification of ICs. One approach, presented by Lester, A. Bazargan-Sabet, P. Greiner, A. in "YAGLE, a second generation functional abstractor for CMOS VLSI circuits", *Proceedings of the Tenth International Conference on Microelectronics*, 1998, pages 265-268, (hereinafter "YAGLE"), is based on a functional abstraction method using a circuit disassembly procedure. YAGLE is primarily applicable to the abstraction of netlists to reduce their simulation time. It does not, however, provide human comprehensible results. Further, the approach in YAGLE is rather susceptible to netlist inaccuracies.

Another approach, presented by Boehner, M. in "LOGEX—an automatic logic extractor from transistor to gate level for CMOS technology", *Proceedings of the 25th ACM/IEEE Design Automation Conference*, 1988, pages 517-522, provides a rule-based abstraction from transistor level to gate level. One of the shortcomings of this approach is its lack of a feasible rule-based approach for higher level abstraction at above the gate level.

Another known approach can be found in a publication by Ohlrich, M.; Ebeling, C.; Ginting, E.; and Sather, L. entitled "SubGemini: Identifying SubCircuits using a Fast Subgraph Isomorphism Algorithm", *Proceedings of the 30th international Design Automation Conference*, 1993, pages 31-37. While SubGemini discussed in Ohlrich, M. et al. is one of the most significant algorithms in the field, it requires a completely known base library. As such, it is not well suited for high-level functional identification in view of modern optimization timing modification and synthesis techniques.

Therefore there remains a need for new IC analysis systems and methods that overcome some of the drawbacks of known approaches, or at least, provide a useful alternative to the public.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the invention is to provide a new IC analysis system and method. In accordance with different aspects of the invention, there are provided different IC analysis method and systems as substantially described herein.

A further object of the invention is to provide a new IC analysis system and method for representing a collection of gates in an IC with a functionally equivalent logical block, using a probabilistic model combined with partitioning hints, fingerprint matching and graph matching.

Another object of the invention is to provide a method and system for progressively characterizing a gate level netlist of an IC by growing a selected sub-graph using various growth strategies and partitioning hints.

In accordance with one aspect of the invention, there is provided a method of analyzing at least one target netlist or a portion thereof from at least one first integrated circuit (IC), using at least one reference netlist or a portion thereof from at least one reference IC, the method comprising the steps of: a) characterizing said target netlist or a portion thereof to obtain a plurality of characterizations for said target netlist or said portion thereof; b) characterizing said at least one reference netlist or a portion thereof to obtain a plurality of characterizations for said at least one reference netlist or said portion thereof; c) matching the plurality of characterizations obtained in step a) with the plurality of characterizations obtained in step b), and d) extracting the matching information obtained from step c).

In accordance with another aspect of the invention, there is provided a method of characterizing at least one target netlist or a portion thereof from at least one first IC, using at least one reference netlist or a portion thereof from at least one reference IC, said reference netlist or a portion thereof having a characterization of a portion of said reference IC, the method comprising the steps of: a) selecting a seed portion from said target netlist or a portion thereof; b) characterizing the seed using a structural data mining technique to obtain a characterization of the seed; c) matching the seed with said reference netlist or said portion thereof, and if matched, growing the seed using a growing strategy to include an adjacent seed, and repeating steps b) to c); and d) otherwise, discarding the seed.

In accordance with another aspect of the invention, there is provided a method of progressively characterizing a graph representing a gate level netlist or a portion thereof of an IC, using at least one reference netlist or a portion thereof from at least one reference IC, said reference netlist or a portion thereof having a hash characterization of a portion of said reference IC, the method comprising the steps of: a) selecting a seed subgraph from the graph; b) computing a hash value of the seed subgraph; c) matching the computed hash value with the hash values of said reference netlist or said portion thereof, and if matched, growing the seed subgraph using a growing strategy to include an adjacent subgraph, and repeating steps b) to c); and d) otherwise, discarding the seed subgraph.

In accordance with another aspect of the invention, there is provided a system for analyzing at least one target netlist or a portion thereof from at least one first integrated circuit (IC), using at least one reference netlist or a portion thereof from at least one reference IC, the system comprising: a memory having computer readable code embodied therein, for execution by a CPU, said code comprising: a) code means for characterizing said target netlist or a portion thereof to obtain a plurality of characterizations for said target netlist or said portion thereof; b) code means for characterizing said at least one reference netlist or a portion thereof to obtain a plurality of characterizations for said at least one reference netlist or said portion thereof; c) code means for matching the plurality of characterizations obtained in step a) with the plurality of characterizations obtained in step b), and d) code means for extracting the matching information obtained from step c).

In accordance with another aspect of the invention, there is provided a system for analyzing at least one target netlist or a portion thereof from at least one first integrated circuit (IC), using at least one reference netlist or a portion thereof from at least one reference IC, the system comprising: a memory having computer readable code embodied therein, for execution by a CPU, for characterizing said target netlist or said portion thereof, using said reference netlist or a portion thereof, said reference netlist or a portion thereof having a characterization of a portion of said reference IC, said code comprising: a) code means for selecting a seed portion from said target netlist or a portion thereof; b) code means for characterizing the seed using a structural data mining technique to obtain a characterization of the seed; c) code means for matching the seed with said reference netlist or a portion thereof, and if matched, growing the seed using a growing strategy to include an adjacent seed, and repeating steps b) to c); and d) code means for otherwise, discarding the seed.

In accordance with another aspect of the invention, there is provided a system for analyzing at least one target netlist or a portion thereof from at least one first integrated circuit (IC), using at least one reference netlist or a portion thereof from at least one reference IC, the system comprising: a memory having computer readable code embodied therein, for execution by a CPU, for progressively characterizing a graph representing said target netlist or a portion thereof, using said reference netlist or a portion thereof, said reference netlist or said portion thereof having a hash characterization of a portion of said reference IC, said code comprising: a) code means for selecting a seed subgraph from the graph; b) code means for computing a hash value of the seed subgraph; c) code means for matching the computed hash value with the hash values of said reference netlist or said portion thereof, and if matched, growing the seed subgraph using a growing strategy to include an adjacent subgraph, and repeating steps b) to c); and d) code means for otherwise, discarding the seed subgraph.

BRIEF DESCRIPTION OF THE DRAWINGS

The invention will be described with reference to the accompanying drawings, wherein:

FIG. 4 is an example of the internal characterization structure of the library created in FIG. 3;

FIG. 6 is a schematic diagram of the process of growing a seed circuit element according to one embodiment of the invention;

FIG. 9 is a schematic diagram of a general queuing structure used in the target mining process in accordance with one embodiment of the invention;

FIGS. 10 and 11 are schematic diagrams of an exemplary process for finding structures in a target IC;

DETAILED DESCRIPTION OF THE INVENTION

The different embodiments of the invention described herein address certain challenges in analyzing low level netlists to understand the function(s) embodied within an IC, particularly with respect to relatively large low level netlists for which such challenges are amplified. For the purposes of this description, the terms "low level", "gate level" and "cell level" netlists may be used interchangeably and generally refer to a lower level netlist from which further processing is generally required to ascertain various hierarchies, modularity and/or functionalities within a target IC.

Figure 1:
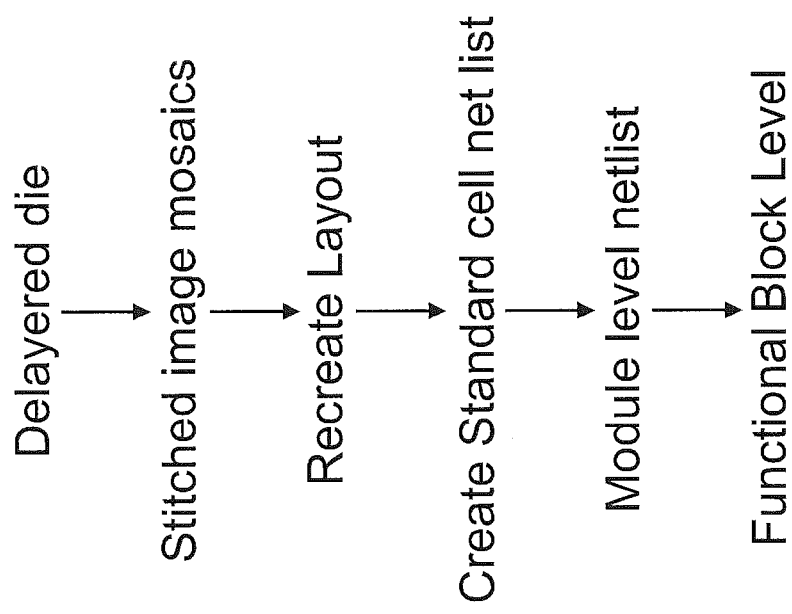
FIG. 1 demonstrates the general steps involved in reverse engineering of an IC.

The flowchart in FIG. 1 illustrates the general steps involved in analysing an IC according to various embodiments of the invention disclosed herein, from the initial steps implemented in recreating the layout of the IC and creating a standard cell net list representative thereof, to the creation of a module level netlist and function block level description. For example, in one embodiment, the cells can be automatically extracted from IC image and layout data using one or more of human operated/implemented and/or one or more partially or fully automated processing systems.

Referring to FIG. 1 and in accordance with one embodiment of the current invention, reverse engineering an IC starts with delayering the IC, imaging each of the layers, and stitching all images to form a mosaic of images. The connections between all components are then obtained so as to recreate a board level circuit layout. Standard cells can be manually or automatically extracted from IC image mosaic and layout data. Once extracted, the cell instances may be connected manually, automatically or in a combination thereof via one or more facilitating systems, to create a cell level netlist of the analysed device. The cell level netlist can be further analyzed manually or automatically so that hierarchical module level netlist or high-level functional block schematics can be obtained. It should be noted that while such cell-level netlists can contain some inaccuracies caused by device deprocessing, imaging, and image recognition artefacts, such inaccuracies can be sufficiently accounted for in the overall process to produce usable results. Namely, while design applications are generally highly sensitive to netlist inaccuracies, the methods and systems described herein, given their general application to reverse engineering contexts, can proceed to provide consumable results in spite of potential inaccuracies in the initial netlist.

As will be understood by the person of skill in the art, the methods and systems described herein may, in different embodiments, be implemented from different starting points. For example, in one embodiment, the method and system may be configured to enable and/or facilitate steps implemented with respect to each of the process steps identified in FIG. 1, and/or others relevant thereto but not explicitly shown. Namely, the system and method may be configured to recreate a target layout from a delayered die and stitched image mosaics, and proceed to create a reference standard cell net list from which a module level and/or functional block description can be generated. In other embodiments, the method and system is configured for implementation from a previously created standard cell net list, to generate therefrom, a module level and/or functional block description of the target IC.

The process of reverse engineering an IC may introduce various errors such as irregular shapes and line thicknesses, registration errors, connectivity errors, and the like, and can be even further complicated when dealing with levelling issues caused by diffusion and wells. As such, it will be appreciated by a person of ordinary skills in the art that processing a reverse engineered layout can be more challenging than processing an original layout that is in Graphic Database System II format (GDSII). Consequently, the reverse engineering process in the art often involves having expert analysts manually identify each unique standard cell in an IC design and identify its function. This may take such an expert up to several weeks for designs using a large library of cells.

Generally, it is possible to automate the reverse engineering process up to the step of standard cell netlist creation, via one or more computationally facilitated means (i.e. software and/or hardware enabled applications, algorithms and/or devices). In one embodiment of the current invention, the system and method are also implemented to analyse an IC to extract therefrom the low level netlist (NAND, NOR, DFF, MUX, etc.), from which further analysis and netlist organisation can be implemented. For example, in one embodiment, low level netlists can be generated for up to several hundred thousand standard cells, i.e. for up to a million transistors. Nevertheless, there remains a need in the art to bridge the gap, at least to some extent, between a low level netlist and a human readable high level description of the IC.

As an improvement over the common practice in the art requiring routine intervention by human experts, the embodiments of the invention described herein allow for greater automation in identifying modules and/or higher level representations of an IC directly from an IC layout image, or from a previously derived cell level netlist.

In order to make the analysis of digital ICs tractable, particularly for large digital ICs, a reverse engineering process with a similar degree of automation as that is used in their design could be desired. Accordingly, and in accordance with one embodiment of the current invention, an IC analysis system and method is provided relying on the probabilistic classification of the functionality of circuit blocks within the IC, based on structural data mining using a library of known circuit elements. For instance, this system and method relies on the identification and hierarchical representation of common digital blocks (such as adders, multipliers, counters, shift registers, encoders, decoders, crossbars, DACs, ADCs, CAMs, etc.) from a low level netlist, to provide a higher level analysis of the functionalities afforded by an IC comprising a particular combination of such digital blocks.

In one embodiment, the method and system provides human comprehensible results, such that further expert analysis is not required to ascertain a functionality of the analysed IC.

In another embodiment of the current invention, the method and system can be implemented without access to a completely known base library, which in the context of modern optimization timing modification, and synthesis techniques, are not readily available.

Structural data mining refers to the process of finding and extracting useful information from certain structured data sets such as graphs. In accordance with one aspect of the current invention, structural data mining is used to find meaningful structural matches between one netlist and another netlist. More specifically, it is used to locate matches between an IC target and a module library, between a library and another library, or between an IC target and another IC target. The mining process in relation to a target or a library involves representing the target or the library as structured data sets with associated information relating to the target or the library or their components. The structured data sets and the associated information thereof are then characterized using an appropriate mechanism that can be applied to the structured data sets and the associated information. The results of the characterization can then be compared or used to identify matches between the two netlists. According to one aspect of the current invention, graphs are used to represent netlists, and hashes are used to characterize the graphs and labels thereof.

As stated above, IC reverse engineering technologies have been developed to recreate, with a reasonable degree of automation and accuracy, the low level netlist of an IC. For example, standard cell extraction can be implemented to provide a cell or gate level netlists. Such gate level netlists can be represented in Verilog™ text format. In accordance with various embodiments of the current invention, such gate level netlists are modeled using a graph wherein gates are represented as vertices with gate function encoded in labels, and wherein gate connections are represented as edges with connection pins as well as the input and output signal flow directions encoded in labels. Organizing and analysing such netlists into functional, modular and/or hierarchical blocks, however, must still currently heavily rely on substantial expert manual intervention. As of yet, no reasonable solution has been provided to bridge the gap, at least to some extent, between a low level net-list and a human readable high level description of the IC.

Figure 2:
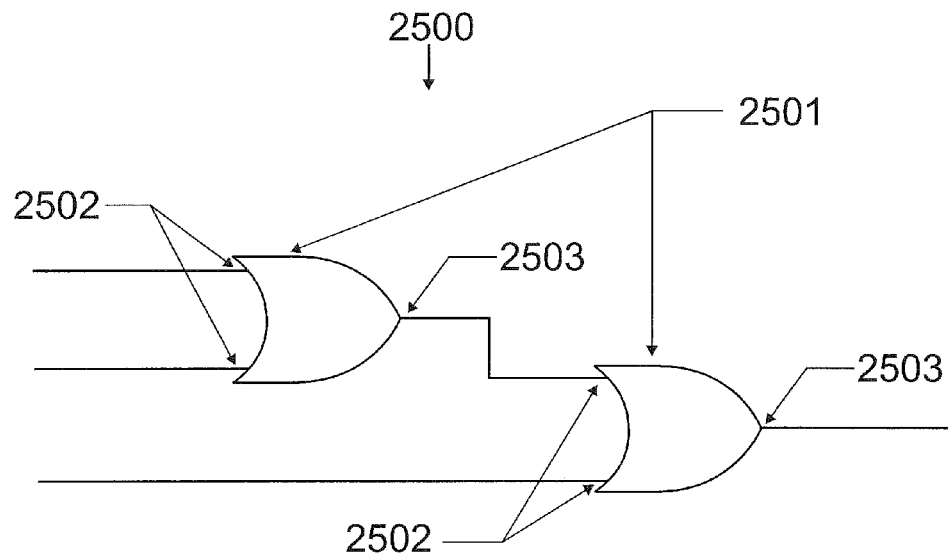
FIG. 2 is an exemplary gate level netlist of an IC and the graph representation of the netlist.
Figure 2:
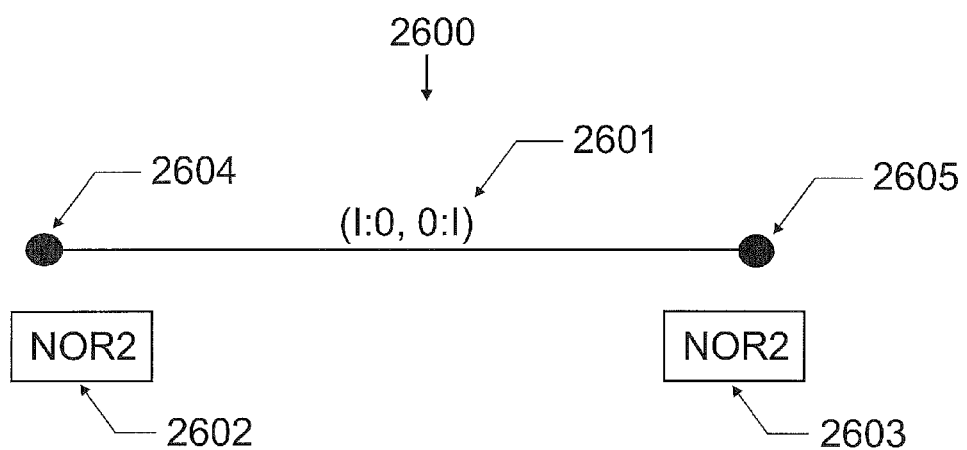

FIG. 2 depicts an exemplary gate level netlist 2500 having two NOR2 gates 2501, each having two inputs 2502 and one output 2503.

In accordance with the current invention, FIG. 2 illustrates a graph representation 2600 of the netlist 2500. Graph 2600 has two vertices 2604 and 2605 representing two gates 2501, which are of function type NOR2 2602 and NOR2 2603, respectively. Vertices 2604 and 2605 are connected through an edge 2601, which denotes two connections between the two gates 2501: one from input to output (I:O) and one from output to input (O:I). Preferably, to save memory and to achieve more optimal results in computation and comparison, labels associated with vertices, edges, function types, and connections in a netlist graph are stored as 64-bit integer hashes computed from their encoded text strings. For the purposes of this description, hash is a function h(X) applied on an object X represented by a bit vector of arbitrary length. The output of the hash function is a value with fixed bit length l. Generally, the probability of a "false positive", a condition where X≠Y but h(X)=h(Y), can be made close to $2^{-l}$. Accordingly, direct comparison between objects can be replaced with comparison between the corresponding hashes of the objects if hash bit length l is sufficiently large. In the preferred embodiment of the current invention where 64-bit hashes are adopted, the probability of a "false positive" match is negligibly low. This means that for the purposes of comparing netlists and the corresponding graphs thereof, equal hashes means equivalent graphs and equivalent netlists.

As will be appreciated by the person of ordinary skill in the art, there may be multiple ways to implement the same higher-level functions in a low level netlist. In the current invention, however, it is recognised that implementations of the same high level functions will generally have some common features (e.g. small fragments of netlist, small Boolean functions, and/or common pattern of connections). For example, such features may represent common hardware algorithms, such as for example, adders (RCA parallel prefix adder, carry skip adder), trees, parallel product generators, multipliers, multiply-accumulators, and the like. Accordingly, upon identifying these smaller blocks, the functionality of higher level blocks can be deduced by looking at the presence and patterns of these smaller blocks.

In some embodiments, the current invention uses a library of digital circuits of known functionality generated by different synthesis tools from slightly different register transfer level (RTL) and with different constraints. In one such embodiment, structural data mining techniques to locate probable matches between portions of the netlist and the library of circuit of known functionality are used. For example, the netlist may be presented by a graph model, from which structural data mining algorithms may be implemented to find subgraphs that are isomorphic (e.g. fragments of the netlist that are the same or equivalent). Not only can graph models be used for netlist representation, and structural data mining used for finding equivalent circuitry for automated schematics generation and/or finding instances of known library elements in a large netlist, these techniques can be used, in accordance with some embodiments, to extract higher level functionality from a netlist.

The high level functional blocks found may be used to substitute the corresponding portions of the netlist having the matched characterizations, and may be annotated accordingly in the resulting netlist.

In one embodiment, a known or proprietary graph model is used for isomorphism and structural data mining, for example, in which a model can be used to reduce the number of vertices and encode information in labels, allowing reduction in the combinatorial time of structural data mining.

In some embodiments, one or more data mining techniques may be used, which may include, but are not limited to, hashing, fingerprinting and alternatives thereto. For example, a set of 64-bit integer "fingerprints" can be computed for a portion of a circuit in a cell level netlist. Equal fingerprints are then identified and used as a starting point for graph matching and to characterize the circuit.

In some embodiments, partitioning hints from structures such as, but not limited to, clock trees, scan chains and/or specific control signals, can also be used to localize the circuits of interest and curtail combinatorial growth of the number of fingerprints to be computed. A critical signals approach and/or feedback loops analysis can also be used.

In some embodiments, the system and method allow to represent a large collection of gates with a specific functional block, via a probabilistic model combining partitioning hints, fingerprint matching and graph matching.

In one embodiment, and as introduced above, a library of digital circuits with known functions generated by different synthesis tools and/or with different options is used to implement the disclosed system and method. For example, this library may be populated by compiling standard hardware algorithms and frequently used higher level blocks; obtaining and/or developing RTL incorporating such frequently used higher level blocks; using different synthesis tools, generating annotated gate and/or low level netlists; and analyzing resulting netlists for similarity, results of optimization, clock tree distribution and test chain.

Figure 3:
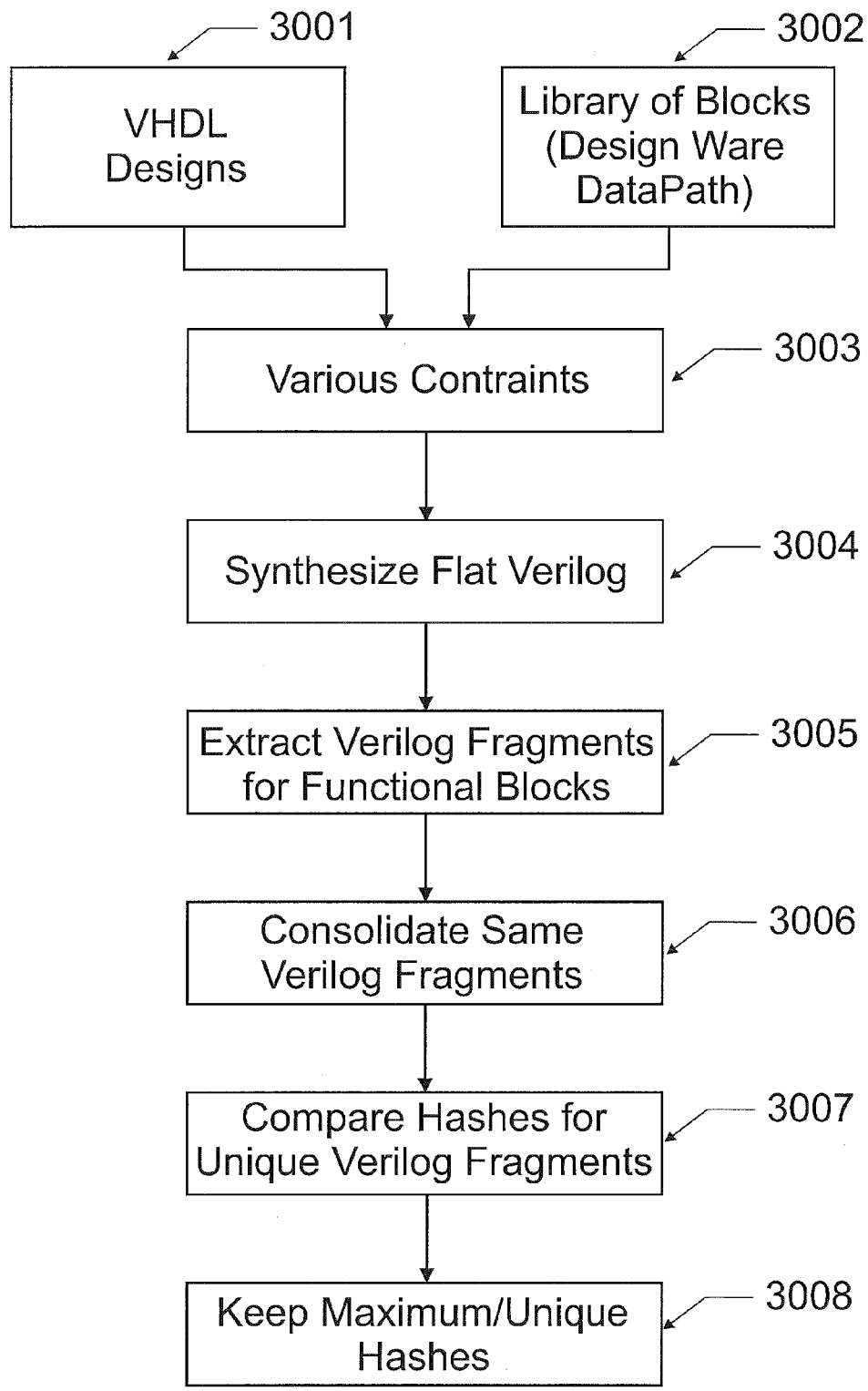
FIG. 3 is an example flowchart for library creation according to one embodiment of the invention.

According to one aspect of the current invention, FIG. 3 exemplifies the process of creating a library of digital circuits with known functions. Initially, RTL-level circuits designed using Verilog™ Hardware Description Language (VHDL) 3001 and DesignWare™ library of known reference functional blocks 3002, with various design constraints 3003 such as speed, area, power, debug/scan circuitry and additional buffers etc, are synthesized into a gate-level flat Verilog™ netlist 3004. From the flat Verilog™ netlist 3004, Verilog™ fragments for the known functional blocks are extracted 3005, and consolidated into unique Verilog™ fragments 3006. Next, hashes of the unique Verilog™ fragments are compared 3007. At the end of the process, the library contains reference functional blocks with unique hashes 3008.

FIG. 4 depicts how the current invention characterizes the library of functional components using hashes. The table in FIG. 4 shows the library structure before step 3008 of the above process of library creation. In FIG. 4, various known functional blocks 3202 are identified at various RTL locations. For example, a component 3203 is located at RTL location RTL (I17, I40, I44), with a hash code 903. This component 3203 has two possible predecessor components of type ADDER 75 identified by a hash code 493. The ADDER 75 with hash code 493 in turn has 70 predecessors of type ADDER 75 found at various RTL locations identified by hash codes 257 and 258. In accordance with one aspect of the current invention, as shown by step 3008 in FIG. 3, it is sufficient to keep only unique hashes for functional components in the library in order to facilitate the characterization of reverse engineered ICs.

In some embodiments, different algorithms can be used to identify and handle global structures such as scan chains, clock tree distribution, and buses for use as partitioning hints.

In some embodiments, different algorithms can be used for identification and extraction of small Boolean functions for inclusion into a graph model.

In some embodiments, different structural data mining algorithms can be used to handle large digital netlists, namely by adjusting prioritization algorithms to curtail combinatorial growth of the number of sub-graph fingerprints needed to be computed. In some examples, algorithm optimization, usage of domain knowledge (e.g., cycles, critical signals), and/or partitioning hints can be used.

To optimize the method and system, in some embodiments, the algorithms can be run and the matches analysed between blocks of the same functionality within an annotated library, and the process repeated iteratively until a sufficient density of matches is found.

In some embodiments, a probabilistic model is used to combine the netlist mining results with the netlist partitioning hints of the functional blocks.

To assess the accuracy of the method or system in a given context, i.e. as a form or system test or calibration, the low level netlist can be extracted from a test vehicle layout, and one or more of the above algorithms applied thereto for comparison.

The following provides different examples relevant to the present matter identifying, in accordance with different embodiments of the invention, various aspects, steps and considerations in implementing the inventive features thereof.

In one embodiment, in order to automatically or at least semi-automatically identify or characterize various components or aspects of an IC, an existing or proprietary library is used for searching and characterizing identified components. In order to effectively apply a search and characterisation of identified components, criteria are set to define what constitutes a match with a library entry, while accounting for a number of relevant factors including computational load and time, feasibility given an applicable search space, potential diversity in matches, search requirements, and possibly, whether such searches are in fact necessary given the application or desired result.

To perform structural data mining, the current invention may use a library of standard cells (i.e. reference net lists). Standard cell libraries generally comprise anywhere from 50 to 250 cells, and may consist of up to 30 PMOS/NIMOS transistors provided in a regular layout (e.g. standard height, rectangles located between Vdd and Vss). In many cases, each cell is used many times within a same design. Accordingly, in accordance with one embodiment of the current invention, a cell library can be substantially recreated from a target device with corresponding cell level netlist.

The current invention can be adapted to work with various standard cell matching processes. In theory, matching of standard cells is a straightforward exact matching process, however in practice, using a real reverse engineered layout, a similarity metric is generally used to accommodate, in some embodiments, variations in shape of the GDSII, missing features, misalignment between imaged layers, missing layers (e.g. wells and diffusion), usage of cell areas for routing, variations in brightness and contrast, and the like. For example, the current invention can be adapted to match variations of NOR gates with invert input cell found in a 32-bit DVD microcontroller.

The current invention can also be adapted to work with various search spaces for standard cells in ICs. Search space refers to the scope of an IC cell-level netlist within which the identification of a functional module is to be performed. In the worst case scenario, the search space for standard cells comprises the number of pixels in the image. In practice, however, the search space can be reduced by pre-identification of standard cell rows, establishing probable cell boundaries, aligning salient features (e.g. corners, vias), and the like, leading to a more tractable search space thereby facilitating standard cell extraction. Generally, the search space comprises a multiple rows or columns of standard cell array.

In general, modules are built from standard cells. For example, simple modules may include, but are not limited to, a 4-bit adder, a 4-input decoder, a 4-input MUX, an 8-bit register, and the like. More complex modules may include, but are not limited to, a 32-bit adder, a multiplier, a barrel shifter, and the like.

In establishing a module library, various aspects and/or complications may apply depending on the application. For example, in some designs and/or in a given target, a given module (or reference netlist) may only occur once. Also, it may only be unambiguously defined at the behavioural level, e.g. a 16-bit adder, for instance, due to a wide variation at the gate level, which may depend on the synthesis tool, cell library and parameters chosen, speed, area, power, etc. Additional circuitry may also be present, such as debug/scan circuitry, additional buffers, some inputs tied high/low. Furthermore, in some instances, there is no standard layout, wherein gates may be interspersed with gates from other modules. In general, these modules can be more complex, including up to 100 components of all types of cells.

Given these complexities, and in accordance with one embodiment of the invention, module representations may be derived and/or identified from a gate level netlist. For example, in one embodiment, a module may be represented as a directed graph, with N nodes (gates) and M edges (wires), where edges may have a direction (e.g. input or output). Using this approach, various methods or processes may be considered in identifying modules. One method is image matching, which generally requires using well defined search patterns to find the match. Typically, image match has a worst case match evaluation time that is proportional to $M^2$. Another option is to use pattern matching, where any node can be connected to any other node in the graph, such that no defined search pattern is generally available as all possible paths at every node must generally be evaluated leading to a worst case processing time proportional to $N!$. Another approach is to use module search space, which entails solving the problems of sub-graph isomorphism and finding a small graph in a large graph. Module search space method can be a problem of significant complexity with no known solution in polynomial time, or in mathematically terms, it is a NP-complete problem.

In summary, some module identification issues include difficulties in establishing a full library from a given target, potential combinatorial explosion of possible matches and search space with module and library size, and difficulties in matching at the behavioural level, where target is only described at the gate level.

Accordingly, and in accordance with one embodiment of the current invention, a library is provided comprised of synthesized designs, e.g. comprising modules of known function, using different synthesis tools and/or options, and being as exhaustive as possible, enabling efficient search and matching between library and target using structural data mining In one embodiment, the modules may be used to substitute the corresponding portions of the target netlist having the matched characterizations, and may be annotated accordingly in the resulting netlist.

According to one embodiment of the current invention, the structural data mining process involves selecting seeds in a target IC, growing the seeds, and analyzing the matched seeds. For the purpose of this description, seeds are small, repetitive but non-trivial circuit fragments such as ALU modules. The seeding process begins with selecting initial seeds in the target IC that match with the module library. Starting with small initial seeds has the advantage of being less expensive to calculate. At this stage, initial matches in the library do not guarantee a module match, and multiple matches to the library may be likely.

In one aspect, the structural data mining allows for a more practical approach to finding meaningful structural matches between a library and a target.

Figure 5:
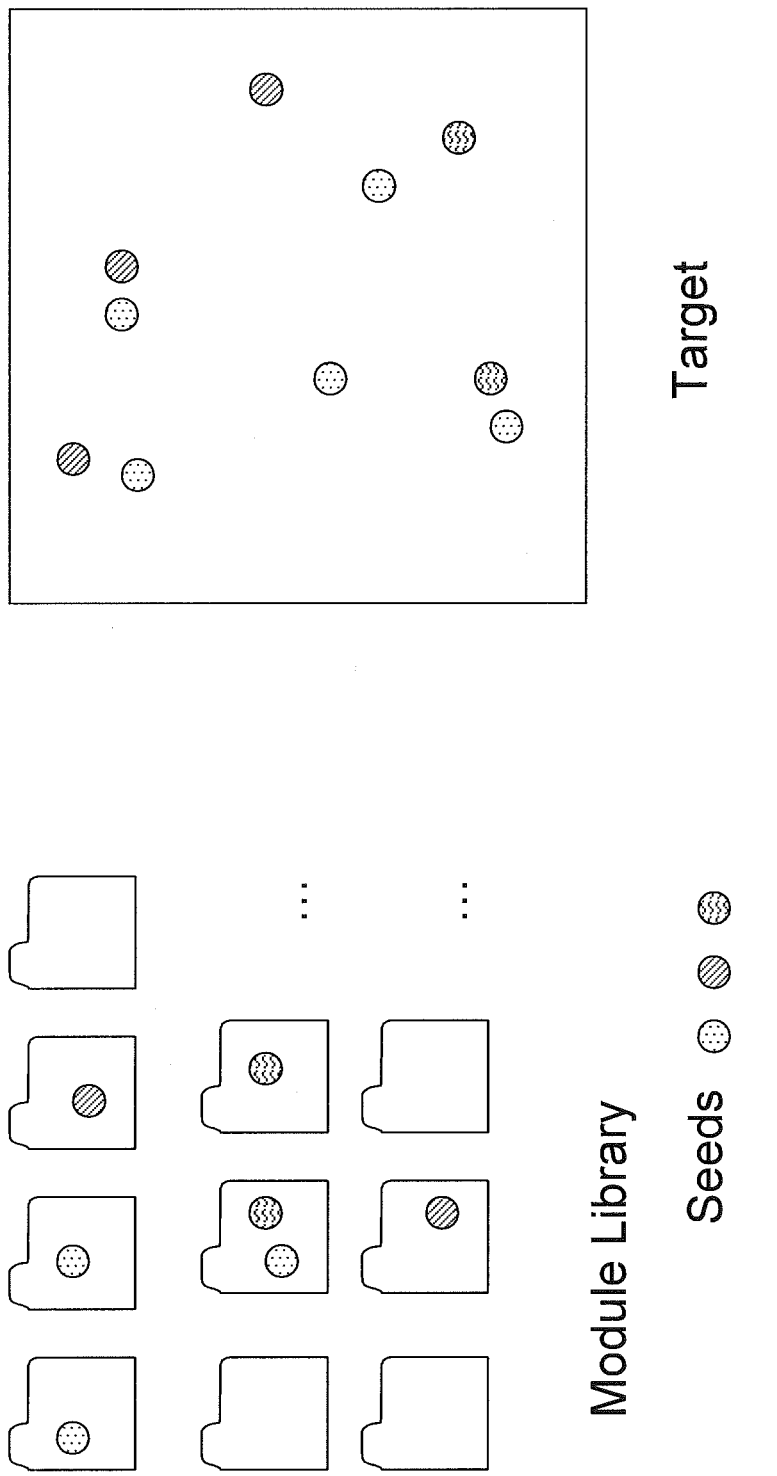
FIG. 5 is a schematic diagram of an exemplary process of selecting a seed circuit element in a target IC.

Referring to FIG. 5 and in accordance with one aspect of the invention, the first step of the seeding process is selecting an initial seed in the target IC. Next, the process involves matching the selected seed in the module library, which can be any pre-existing library including a library generated from the target IC. The steps of selecting initial seed and initial matching can be executed multiple times either sequentially or in parallel so as to obtain a set of matched seeds representing a set of candidate matches between the target IC and the module library. In case there are matches between the seeds and the module library, the process next involves growing the seeds.

Referring to FIG. 6, after a seed matching is found between the target IC and the module library, the matched seed may then be progressively grown by adding gates to the seed or by merging or overlapping with adjacent matched seeds. The seeding process and all of it steps described herein may be continued until a library component is complete or until no library matches can be found.

For example, in FIG. 6, seed $A_0$ is an initial seed representing a small circuit fragment with occurrences N10, N20 and N50 etc. in the target IC. The initial matches of $A_0$ with the library are modules L1, L2, L3, L4 and L5. Next, seed $A_0$ is grown into seed $A_1$ to include additional gates or matched seeds. As a result, seed $A_1$ represents a different and larger circuit fragment with occurrence N10, N50 and N55 etc. in the target IC. Correspondingly, seed $A_1$ matches with modules L1, L3 and L5. The seed growing continues until no more matches can be found in the library for a seed $A_n$.

Choosing appropriate starting seeds and growing method are important considerations with respect to the cost of seed matching. Accordingly, in one embodiment of the current invention, the seeding process is adapted to identify and operate from optimal starting seeds and to adopt efficient growing strategy. For example, in one growing strategy, the growing may be curtailed using partitioning hints Also, growing prioritization may be applied to selected candidates based on the engineering principles that larger seeds are better than smaller seeds, and that seeds with fewer occurrences are better than seeds with frequent occurrences. In other words, seeds with more vertices or edges will be chosen to grow over seeds with less vertices or edges; seeds that occur infrequently in the target IC will be chosen to grow over those seeds that occur more frequently in the target IC.

As will be appreciated by the person of ordinary skill in the art, the above may have several advantages over brute force seed growing methods. The advantages may include, but are not limited to, a reduction in the search space in the target by only growing from matching seeds; an efficient reduction in the number of candidate library matches; an ability to pre-compute the library, leading to a reduction in computation time.

In accordance with various embodiments of the invention, a number of possibilities may be considered for choosing seeds, which may include a single gate, two connected gates that are somewhat unique, directed vicinity (e.g. cone), and non-structural modules such as Boolean functions. Selecting optimal seeds can be based on different considerations. In selecting most optimal seeds, different considerations may be applied, for example, based on a commonality of the selected seed (e.g. a seed that is too common will not sufficiently limit candidate modules) and uniqueness (e.g. more unique the better).

Figure 7:
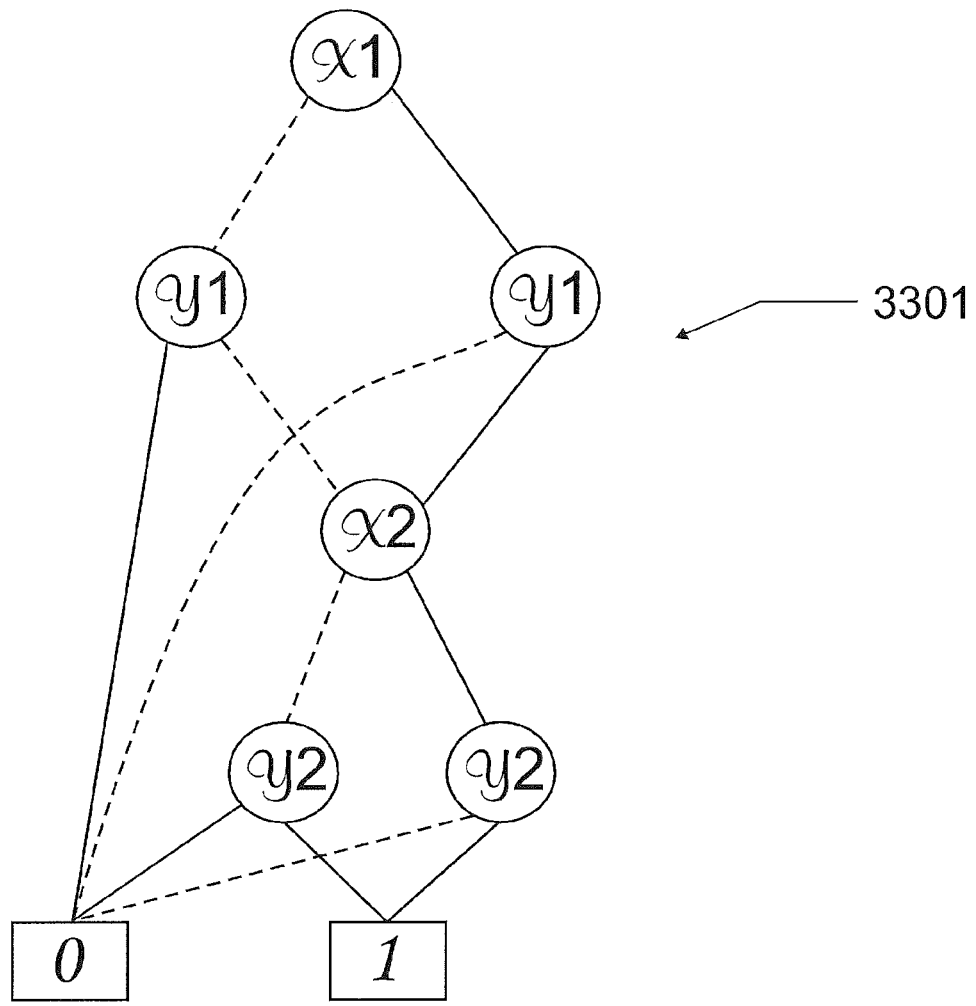
FIG. 7 is a sample Boolean determination diagram.

Yet another way is to heuristically choose a small portion of the netlist that is likely to be a functional block by considering the number of inputs and outputs of the block, or the clock and reset signals thereof. The heuristically selected seeds will be subject to logical functionality characterization by computing its Boolean truth table or binary decision diagram (BDD) and applying hashing to the Boolean truth table or BDD. The Boolean function will then be used to substitute those portions of the netlist that comprise the Boolean function with a single version of representation, labelled by the characterization of the Boolean function. This heuristic approach to seed selection thus facilitates the identification of netlist fragments with the same logic but different gate level implementations. FIG. 7 is a schematic diagram showing a BDD 3301 for a Boolean module 3302.

Figure 8:
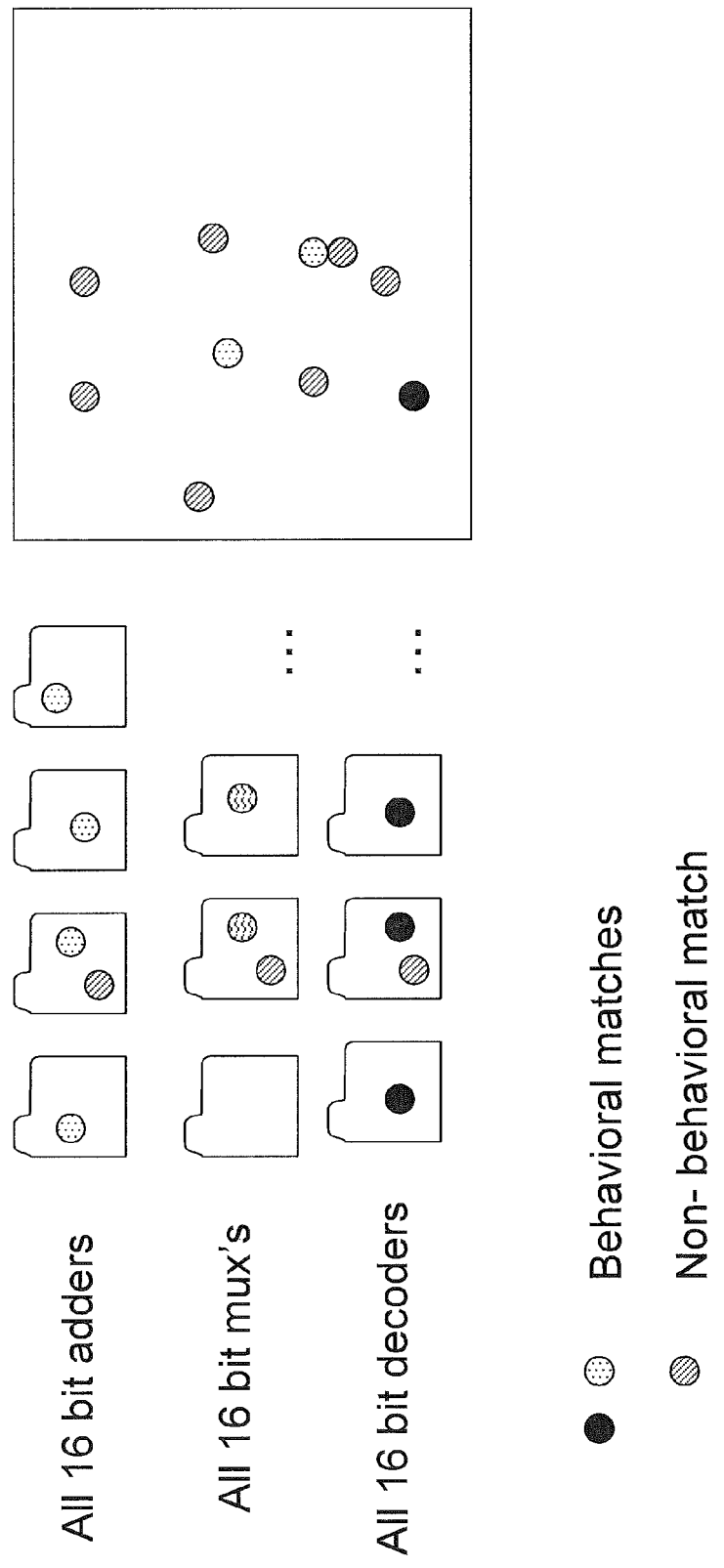
FIG. 8 is a schematic diagram of the process of forming behavioural type seeds according to one embodiment of the invention.

Based on the above seed selection strategies and in accordance with one embodiment of the current invention, behavioural type seeds, such as 16-bit adders, 16-bit 20 MUX and 16-bit decoder etc., may be considered as optimal seeds. FIG. 8 provides a schematic diagram of behaviour type seed matching process. In one example, many different seeds are computed from the target IC. Those seeds with high co-occurrences for one circuit family and low occurrences in other families are selected to form behavioural type seeds. These behavioural type seeds can be stored in a separate library for a subsequent library to library matching with an existing module library.

In one embodiment, the method and system are adapted to identify non-library elements and/or inexact matches. For example, definitions for inexact matches may still be derived using the library. For instance, multiple definitions/heuristics may be attempted for an inexact match, and run through the library; good definitions can match different versions of the same module together, while bad ones can match different modules together, for example. In one example, instances are matched to behavioural seeds in the library to identify function and some of the inputs and outputs. Heuristics may also be used to look for equivalencies, and partitioning hints may be used to limit the new module.

According to one aspect of the current invention, various structural data mining techniques can be applied to the various seeding processes described above as well as to target ICs and various module libraries. To facilitate the target mining process, FIG. 9 provides a schematic representation of a general queuing structure, wherein each seed is associated with a list of circuit fragment occurrences in the target IC and a list of module occurrences in the module library.

In one embodiment of the invention, the seeds may be further or alternatively characterised by hashes. Both the library and target can be indexed by seed extraction and their hashes stored in a data structure. In such embodiment, initial matches may be produced by finding matching seeds in the queuing data structure through hashing or any appropriate method.

In accordance with one aspect of the current invention, FIG. 10 and FIG. 11 provide a schematic representation of a target mining example for finding circuit structures in the target IC. FIG. 10 shows how the seeding process can be used to identify a potential new module or reference functional block in the target IC. A potential new module can be identified when at the end of the seed matching and growing process, the corresponding seed $A_n$ does not have a match in the module library.

Referring to FIG. 11 and in accordance with one embodiment of the current invention, 16-bit ALU behavioural seeds are used in the matching and growing process. In this case, the seeding process has identified all pre-existing 16-bit ALU modules in the library under seed $A_l$. An unmatched seed $A_n$ at the end of the process means that a new 16-bit ALU has been identified.

Figure 12:
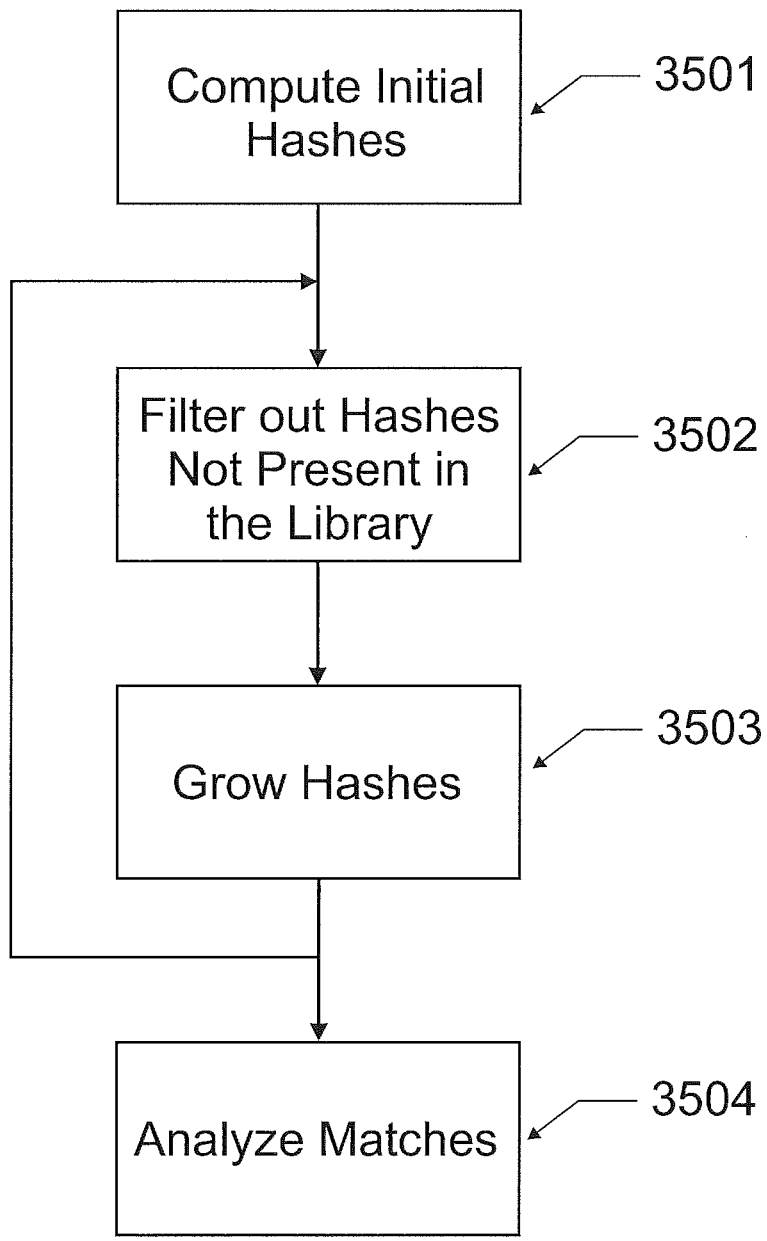
FIG. 12 is an exemplary flowchart for progressively characterizing a subgraph.

As described above, the structural data mining process disclosed herein involves characterizing labelled graphs by hashing. According to one aspect of the current invention, FIG. 12 shows the previously described seeding process from a characterization perspective. In other words, the process below describes the seeding process with respect to the graph representations of the target or library to be mined. The process starts with selecting an initial subgraph from the target graph model and computing the subgraph's hash value 3501. The process next involves determining whether the hash value exists in the library 3502. If the hash value is found in the library, then the process grows the selected subgraph 3503 as will be described shortly. If, however, the hash value is not in the library, then the selected subgraph is discarded because it will not contribute to the identification of functional blocks in the netlist. The steps of selecting initial subgraph and initial hash lookup can be executed multiple times either sequentially or in parallel so as to obtain a set of matched hashes representing a set of matched subgraphs between the target IC and the module library.

Figure 13:
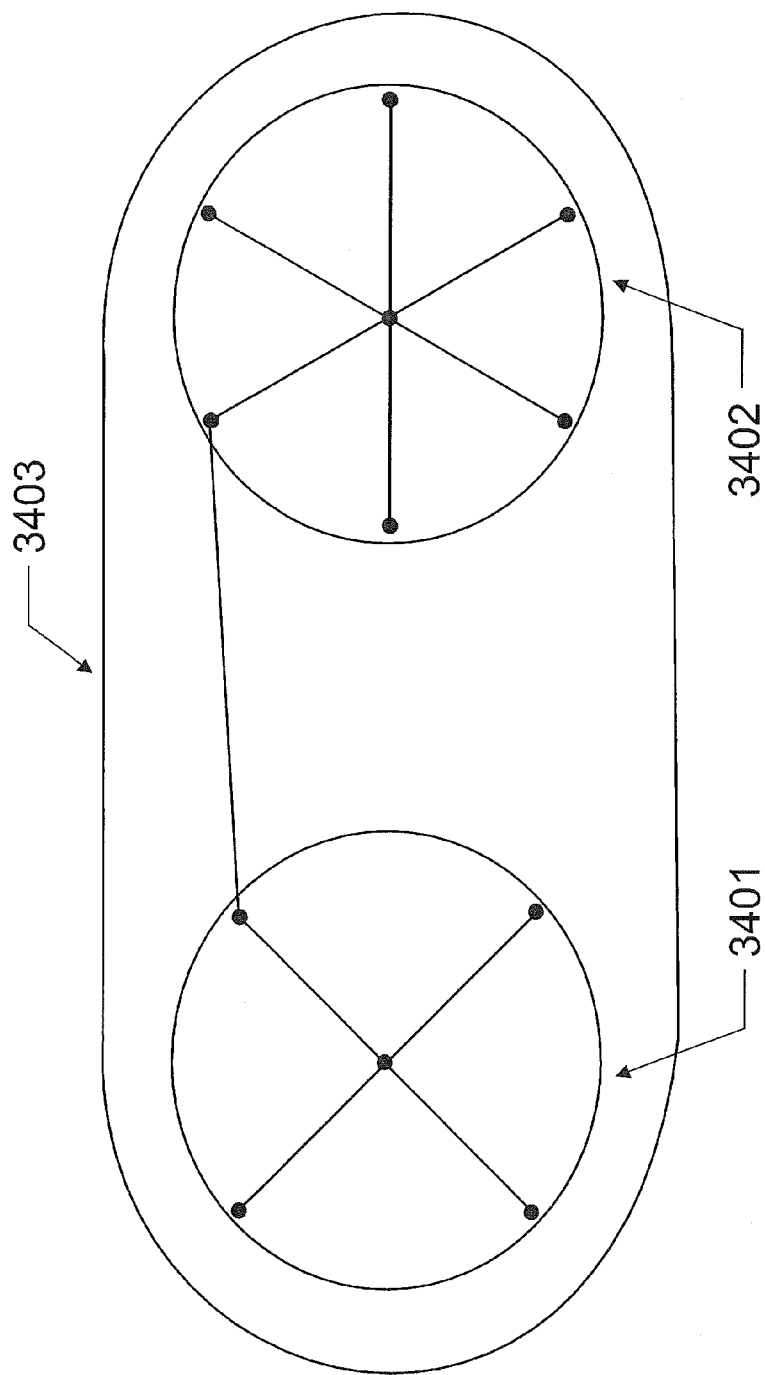
FIG. 13 is an example of two subgraphs merging into one.

Referring to FIG. 13, after the hash value of a subgraph is found in the module library, the selected subgraph 3401 or 3402 may then be progressively grown by adding another subgraph 3402 or 3401 to the selected subgraph or by merging or overlapping with adjacent subgraphs with matched hashes to form a bigger, connected subgraph 3403. The characterization process and all of it steps described herein may be continued as long as there are subgraphs to grow. At step 3504 of the process, shown in FIG. 12, relevant information in the library associated with the found hash value is used to identify functional blocks in the netlist of the target IC.

Figure 14:
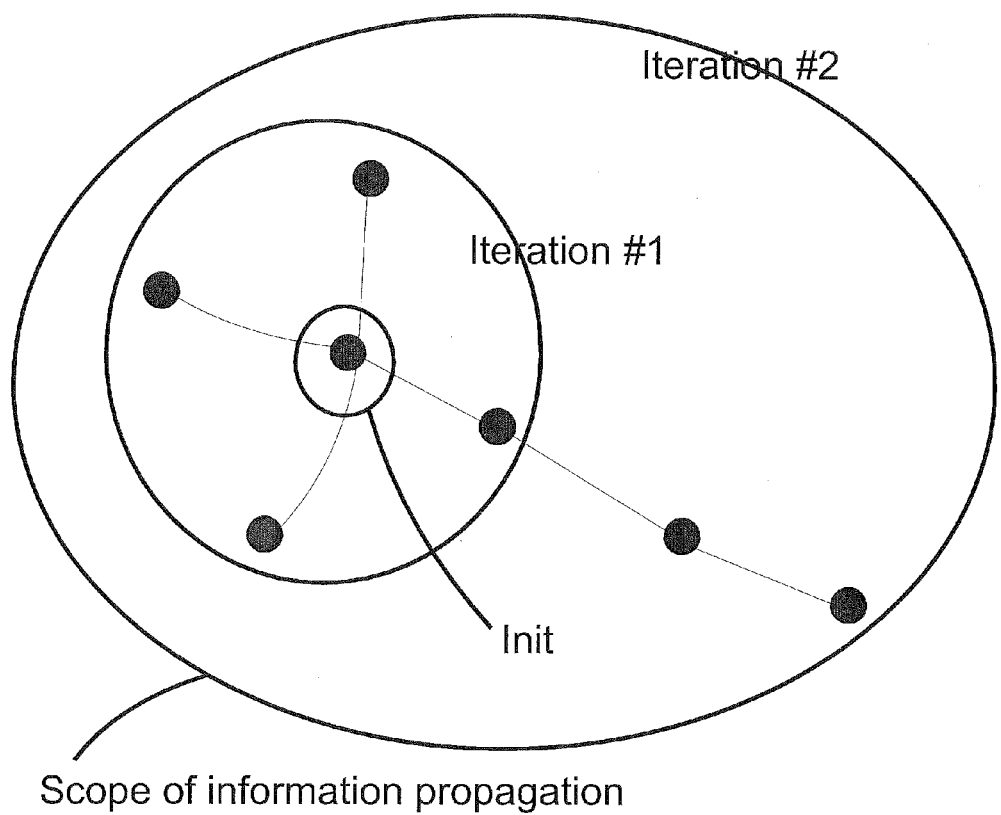
FIG. 14 is a schematic diagram of the process of characterizing a labelled graph using alternative hashing algorithm.

Referring to FIG. 14 and in accordance with one embodiment of the current invention, an alternative hashing algorithm is used to characterize labelled graphs during the process of subgraph growing. The alternative hashing algorithm can characterize graphs with M edges and diameter d in M log(d) operations. The graph is characterized by hash of all the hashes of its vertices. It involves iterating through each vertex in a subgraph and characterizing its neighbouring vertices. In the beginning of the process, a vertex is characterized by the hash of its label, following which the vertex is characterized by its current hash, the labels of its incident edges, and the current hashes of its adjacent vertices. The effect of this alternative hashing is that after each iteration the diameter of the effective neighbourhood increases by a factor of two.

In one embodiment of the current invention, match criteria may include editing distances on the graph, computing hashes on subgraphs and relying on statistical co-occurrences of hashes, hashing of small Boolean functions and relying on their statistical co-occurrences, and the like.

During the subgraph growing process, subgraphs spanning across functional block boundaries generally lead to exponential increase in number of unmatched hashes. To limit a subgraph's expansion into another functional block, it is beneficial to give lower priority to certain kind of connections such as connection on power or debug signals, unless those signals are small and likely be local to a block, and give higher priority to signals that are typically "in-block" (e.g. small feedback loops).

Furthermore, or alternatively, partitioning heuristics can be used to guide hashing and matching processes. Examples of heuristics include loop detection, register as boundary, clock tree distribution, test circuitry, power distribution, and important/critical signals (e.g. small number of signals that depend on or influence many, for example, as per "yaggle" tool).

In one embodiment, the queue is organized as to map each graph hash to a list of its respective occurrences.

In one embodiment of the current invention, during structural data mining, the hash of a graph is computed (for exact match) and declared the same if hashes match, without needing to find gate to gate matches.

For inexact matching, the hashes (e.g. specific sub graphs) may be organized as a metric data structure, e.g., as a metric tree as per Sergei Brin.

In one embodiment of the current invention, netlist matching is implemented in addition to layout matching. For example, the system may be configured to identify good matches, as opposed to correlations in layout domain, namely by implementing an efficient combinatorial search algorithm for matching, as opposed to straightforward location based search in layout domain.

In addition, or alternatively, the system and method described herein may be configured to produce library to library matches, e.g. to mine patterns that are characteristic to modules and functional blocks (i.e. reference netlists). This type of matching may be used to better define matching criteria, adjust (e.g. tune up) algorithms and heuristics, assess the exhaustiveness of the library, and provide for a double blind test, to name a few.

In addition, or alternatively, the system and method may be configured to match the library to the target netlist, namely by identifying modules with known functions that exist in the library.

In addition, or alternatively, the system and method may be configured to match one target netlist to another target netlist, namely by identifying repeatable modules that may not be found in the library.

In addition, or alternatively, the system and method may be configured to implement Boolean module matching. For example, binary decision diagrams could be used for verification. Their construction and comparison can be relatively efficient. While these are not generally tolerant to errors (which may be inevitable in a reverse engineering process due to artefacts, for example), they may still be particularly applicable to smaller modules, for example. In one embodiment, pre-identified inputs and outputs are provided via a combinatorial search space to identify module boundaries and thereby enable or facilitate Boolean module matching. FIG. 7 provides a schematic diagram for Boolean module matching.

As described above, different methods and systems are provided, in accordance with different illustrative embodiments of the invention, wherein a standard cell level netlist can be extracted, or used as a starting point, optionally with at least some partitioning or partitioning hints, to achieve a higher level netlist wherein a majority, or at least a significant subset of modules (e.g. arithmetic algorithms, registers, etc.), are grouped and their behavioural description derived.

It is apparent that the foregoing embodiments of the invention are exemplary and can be varied in many ways. Such present or future variations are not to be regarded as a departure from the spirit and scope of the invention, and all such modifications as would be obvious to one skilled in the art are intended to be included within the scope of the following claims.

The invention claimed is:

1. A method of analyzing at least one target netlist or a portion thereof from at least one first integrated circuit (IC), using a plurality of reference netlists or portions thereof front at least one reference IC, wherein higher than gate level functionality of said target netlist or a portion thereof is unknown and higher than gate level functionality of said reference netlist or portions thereof known, the method, implemented using a computer, comprising the steps of:

a) characterizing said target netlist or a portion thereof to obtain a plurality of characterizations for said target netlist or said portion thereof;

b) characterizing said plurality of reference netlists or portions thereof to obtain a plurality of characterizations for said plurality of reference netlists or portions thereof;

c) matching the plurality of characterizations obtained in step a) with the plurality of characterizations obtained in step b), and d) extracting the matching information obtained from step c) and annotating the said target netlist or a portion thereof using the extracted matching information by associating the previously unknown higher than gate level functionality of said target netlist or a portion thereof with the higher than gate level functionality of the reference netlist or portion thereof having the matched characteristics.

2. The method according to claim 1, wherein at least one of the first IC is identical with at least one of the reference IC.

3. The method according to claim 1, wherein the plurality of reference netlists is synthesized from at least one from the group consisting of Verilog™ Hardware Description Language (VHDL) designs; library of functional blocks, and design constraints.

4. The method according to claim 3, wherein the step of characterizing in step b) comprises:

a) extracting VHDL fragments for the synthesized circuits;

b) consolidating the extracted fragments for the synthesized circuits;

c) computing hashes for the consolidated fragments; and d) comparing the computed hashes and retaining blocks with the maximum unique hashes.

5. The method according to claim 1, wherein the step of characterizing in step a) or b) comprises hashing.

6. The method according to claim 1, wherein the step of characterizing in step a) or b) comprises fingerprinting.

7. The method according to claim 1, wherein the step of matching in step c) comprises inexact matching.

8. The method according to claim 1, wherein the method is guided by partition hints.

9. The method according to any one of claims 1 to 8, further comprising, after step c), the steps of:

e) substituting a plurality of portions of the target netlist with a plurality of portions of the reference netlist having matching characterizations therewith.

10. A system for analyzing at least one target netlist or a portion thereof from at least one first integrated circuit (IC), using a plurality of reference netlists or portions thereof from at least one reference IC, wherein higher than gate level functionality of said target netlist or a portion thereof is unknown and higher than gate level functionality of said reference netlist or portions thereof is known, the system comprising:

a memory having computer readable code embodied therein, for execution by a CPU, said code comprising:

a) code executed by the CPU that characterizes said target netlist or a portion thereof to obtain a plurality of characterizations for said target netlist or said portion thereof;

b) code executed by the CPU that characterizes the plurality of reference netlists or portions thereof to obtain a plurality of characterizations for said plurality of reference netlists or portions thereof;

c) code executed by the CPU that matches the plurality of characterizations obtained in executing the code that characterizes said target netlist with the plurality of characterizations obtained in executing the code that characterizes the plurality of reference netlists, and d) code executed by the CPU that extracts the matching information obtained from executing the code that characterizes said target netlist and annotating the said target netlist or a portion thereof using the extracted matching information by associating the previously unknown higher than gate level functionality of said target netlist or a portion thereof with the higher than gate level functionality of the reference netlist or portion thereof having the matched characteristics.

* * * * *